May 8, 1962 D. DE NOBEL ET AL 3,033,791
METHOD OF MANUFACTURING HIGH-OHMIC CADMIUM TELLURIDE FOR USE IN SEMI-CONDUCTOR DEVICES OR PHOTO-SENSITIVE DEVICES
Filed June 30, 1959
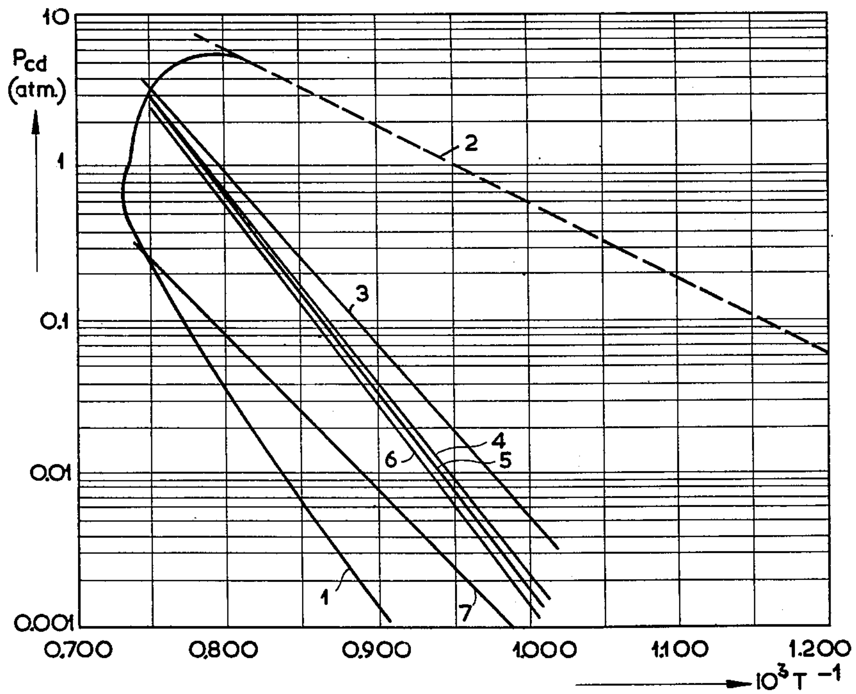
INVENTOR
DIRK DE NOBEL
FERDINAND ANNE KRÖGER
BY
Frank R. Jeffers [signature]
AGENT United States Patent Office 3,033,791

Patented May 8, 1962

3,033,791

METHOD OF MANUFACTURING HIGH-OHMIC CADMIUM TELLURIDE FOR USE IN SEMI-CONDUCTOR DEVICES OR PHOTO-SENSITIVE DEVICES

Dirk de Nobel, Eindhoven, Netherlands, and Ferdinand Anne Kröger, Surrey, England, assignors to North American Philips Company, Inc., New York, N.Y., a corporation of Delaware Filed June 30, 1959, Ser. No. 824,042
Claims priority, application Netherlands May 13, 1958
7 Claims. (Cl. 252—62.3)

This invention relates to methods of manufacturing semi-conductor devices, more particularly photo-sensitive devices, comprising a semi-conductive body of cadmium telluride, in which the cadmium telluride is converted, at least in part, into high-ohmic or high-resistance cadmium telluride. The invention also relates inter alia to semi-conductor or photo-sensitive devices having a cadmium-telluride body which are manufactured by the use of such methods.

As is well-known, cadmium telluride is a semi-conductor which has very advantageous properties as compared to the other semi-conductive chalcogenides of cadmium, such as a comparatively great mobility, a simple controllability of the conductivity from n-type to p-type, and conversely, so that cadmium telluride may be used in semi-conductor devices, such as crystal diodes and transistors. It is also known that cadmium telluride is photo-sensitive to many kinds of radiation, for example to infra-red and visible radiation and X-radiation, so that it may be used in photo-sensitive devices such, for example, as photo-diodes, or as photo-conductive bodies or infra-red telescopes, image intensifiers, camera tubes and photo-electric cells, X-ray dosimeters and the like.

For the above-mentioned applications, it is frequently desirable or required for the cadmium-telluride body to be high-ohmic wholly or in part, for example in connection with a structure desirable for its particular use. This applies more particularly to the use in a photo-sensitive device, in which for the whole body a high dark-resistance is often desired in addition to a high photo-sensitivity. It is obvious that, for this purpose, it is endeavoured to manufacture the cadmium telluride of high purity and stoichiometrically, since intrinsically-conductive cadmium telluride has the maximum possible specific resistance for cadmium telluride. However, it has been found that by these means it is impracticable to manufacture reproducible cadmium telluride having a specific resistance of $10^4$ ohm-cm. and higher, and this principally because for obtaining stoichiometry of the compound the value of the partial pressure of one of the volatile components to be applied during a thermal treatment is extremely critical and thus in practice not adjustable. Thus, for example, with a tempering treatment at 700° C. the partial pressure of cadmium required for obtaining stoichiometry is determined by extrapolation at $1.3\times10^{-2}$ atm., while a decrease of this pressure by only 0.003 atm. already brings about a decrease in specific resistance by a factor $10^5$ and an increase of the pressure by the same amount brings about an even greater decrease of the specific resistance.

An object of the invention is inter alia to provide a method which permits obtaining cadmium telluride having a specific resistance higher than $10^5$ ohm-cm. more particularly higher than $10^6$ ohm-cm., in a simple and reproducible manner. Another object of the invention is inter alia to provide a semi-conductor device, more particularly a photo-sensitive device, having a body of polycrystalline or mono-crystalline material, at least part of which has a specific resistance higher than $10^5$ ohm-cm. and more particularly higher than $10^6$ ohm-cm.

When using the method according to the invention, the cadmium telluride, or at least the portion thereof which is to be converted, is provided with a predominant concentration of impurities active as donors in cadmium telluride up to a content of at least $10^{15}$/cm.$^3$, and heated to a temperature between 500° C. and the maximum melting temperature of cadmium telluride at a partial pressure of cadmium which is lower than the partial cadmium pressure of stoichiometric cadmium telluride at the treatment temperature, but higher than the partial cadmium pressure of solid cadmium telluride which at the treatment temperature is in equilibrium with the liquid, for a time sufficiently long to bring at least the portion to be converted to a specific resistance of at least $10^5$ ohm-cm. and more particularly higher than $10^6$ ohm-cm. Even specific resistances of from $10^7$ to $10^8$ ohm-cm. may thus be obtained in a comparatively simple manner. The term "predominant concentration of impurities active as donors" is to be understood in a sense such that the number of donors must be larger than the number of impurities active as acceptors, while the number of donors must also be larger than the number of intrinsic charge carriers at the treatment temperature.

The invention utilizes inter alia the surprising fact resulting from an extensive investigation, that cadmium telluride provided with donors in the above-mentioned manner may be made high-ohmic by means of a tempering treatment under a comparatively wide range of partial cadmium pressures which are not critical in comparison to the tempering of the stoichiometric cadmium telluride. The probable explanation of this particular effect may be found in the consideration that, due to the presence of the donor impurities in a predominant number, there is formed in the cadmium telluride during heating a plurality of particular deep-lying energy levels consisting of double-negatively charged Cd-vacancies or associates of Cd-vacancies with donors, which yield energy levels about at the center of the forbidden energy zone, for example for indium at 0.6 e.v. from the conduction band, which energy levels are about equal in number to the incorporated donor levels through a comparatively wide range of partial Cd-pressures. During cooling after the tempering treatment, the cadmium telluride becomes high-ohmic due to the high activation energy of this deep-lying level.

Any donor impurities which may be incorporated into cadmium telluride in sufficient number are suitable for use in the method according to the invention. Donors known per se are, for example, all those elements which yield trivalent ions and which may be incorporated into the lattice at a Cd-area, for example, In and Ga, and all those elements which yield monovalent negative ions and which may be incorporated into the lattice at a Te-area, for example, chlorine, iodine and bromine. When use is made of a non-volatile donor, for example indium, it is preferably incorporated into the cadmium telluride via the melt, for example with the aid of zone-leveling, whereafter the tempering treatment leading to the high-ohmic cadmium telluride is carried out as a separate step. However, if use is made of a volatile donor, for example iodine, bromine or chlorine, it is preferably incorporated into the solid material by diffusion instead of via the melt, the tempering treatment being carried out as a separate step or preferably simultaneously. The upper limit of the content to be incorporated is determined by the solubility of the donor impurities, which is usually found to lie at $10^{18}$ or lower. With incorporation of a larger number at a high temperature, so-called cluster effects which occur during cooling may neutralize the specific action of the vacancy level. It has been found that indium is particularly suitable for use as a donor in the method according to the invention. It has also been found that a donor concentration of from $10^{16}$ to $10^{18}$ atoms/cm.$^3$, more particularly from $10^{17}$/cm.$^3$ to $5\times10^{17}$/cm.$^3$, is very favorable. In addition a temperature of from 700° C. to 1000° C. is preferably used during the tempering treatment, since in this range of temperatures the adjustment of equilibrium takes place comparatively rapidly, while at a temperature below 1000° C. there is less risk of troublesome effects, for example sublimation, occurring. It is to be noted that, when this higher temperature is used, the donor concentration must be correspondingly greater, since this concentration must be predominant with respect to the intrinsic charge carriers which are larger in number at a higher temperature.

The method according to the invention has been found suitable for the treatment of cadmium telluride in the pulverulent state. However, it is particularly suitable for use with a polycrystalline or monocrystalline body of cadmium telluride. The method according to the invention may be used in many ways in a manufacturing process aiming at a specified structure of the body suitable for a desired semiconductor device. Thus, for example, it is possible locally to obtain a high-ohmic layer in a CdTe-body by first rendering the whole body high-ohmic by the use of a method according to the invention and then converting the other areas into the desired conductivity type by other conventional techniques, such for example as alloying. If a superficial layer of high-ohmic cadmium telluride is to be incorporated in a body, it is alternatively possible, for example, to use a body homogeneously provided with donors, and to carry out the tempering treatment for a short time only so that only a superficial conversion into high-ohmic cadmium telluride takes place. Another possibility for a local conversion could be found, for example, in providing the body with donors only locally so that the body is converted only locally during the tempering treatment. It will readily be evident that for an expert there are many possibilities of variation within the scope of the invention.

The present invention also extends to a semi-conductor device, more particularly a photo-sensitive device, having a semi-conductive body of cadmium telluride which is high-ohmic at least in part. Such a semi-conductive device according to the invention is characterized in that the specific resistance in the high-ohmic part is higher than $10^5$ ohm-cm., more particularly higher than $10^6$ ohm-cm., a predominant concentration of impurities of at least $10^{15}$ atoms/cm.$^3$ active as donors being present in the high-ohmic region and also a substantially equal number of energy levels not originating from other impurities and located approximately at the center between the valency band and the conductivity band. In the case of CdTe which is doped with In, said energy levels originate from double-negatively charged Cd-vacancies or associates of such vacancies with indium, and are located at approximately 0.6 e.v. from the conductivity band. Such a semi-conductor device may be obtained by the method above described or by a method utilizing the same principle.

In order that the invention may be readily carried into effect, it will now be described in detail, by way of example, with reference to the accompanying drawing and several examples.

The sole FIGURE shows a graph of a P–T diagram of the compound cadmium telluride. The partial Cd-pressure $P_{Cd}$ is plotted vertically on a logarithmic scale in atmospheres, while $10^3\times T^{-1}$ is plotted horizontally on a linear scale, T indicating the temperature in degrees Kelvin. Curve 1 is the solidus line of CdTe which, at the upper end of the figure, merges into the dotted line 2 which represents the vapour-pressure line of cadmium. The straight line 3 shows the P–T characteristic of pure stoichiometric cadmium telluride, in other words the work-points at which pure CdTe changes from n-type to p-type, or conversely. For the manufacture of pure stoichiometric CdTe having intrinsic conductivity, the temperatures and the pressures would have to be adjusted very accurately to the values given by the characteristic 3. However, high-ohmic CdTe cannot be manufactured in a reproducible manner by these means, since the values are too critical. The straight lines 4, 5 and 6 relate to partial cadmium pressures as a function of temperature. Below said pressures, cadmium telluride doped with $1.3\times10^{17}$ In/cm.$^3$, $2\times10^{17}$ In/cm.$^3$ and $5\times10^{17}$ In/cm.$^3$ respectively, may be converted during the tempering treatment into high-ohmic cadmium telluride having a specific resistance of at least $10^5$ ohm-cm. The suitable partial Cd-pressures and the corresponding treatment temperatures are located within the region bounded by the curve 1 and the straight line 3, that is to say, the working range according to the invention is determined, dependent upon the donor concentration applied by the curve 1 and the straight lines such, for example, as 4, 5 or 6 corresponding to the donor concentration applied. The figure shows that the adjustment in this region is not critical and that a variation in pressure by a factor 2 makes little difference. More particularly with prolonged tempering treatments it is not particularly favorable, although possible, to adjust the equilibrium in or near work-points described in the figure by the straight line 7 since for such work-points there applies that the sum for the partial pressures of cadmium and tellurium reaches a minimum value so that troublesome sublimation may occur if no particular steps are taken to prevent this.

Although the characteristics shown relate to CdTe doped with In, they also apply with good approximation to CdTe doped with other impurities active as donors.

The invention will now be explained in detail with reference to several examples. Before proceeding thereto, it is to be noted that the CdTe-bodies discussed hereinafter also have a high photo-sensitivity.

*Example 1*

The initial material was CdTe which had been purified by zone-melting up to an impurity content lower than $10^{16}$/cm.$^3$. By zone-leveling at a pressure of about 1 atm. of Cd, the rod was doped homogeneously with a content of $2\times10^{17}$ of In/cm.$^3$ and brought into the monocrystalline state. The choice of the partial pressures of the volatile components during purification and doping is not essential to the conversion into high-ohmic CdTe, since the conversion does not take place until during the subsequent tempering treatment. A large number of small monocrystalline rods having the dimensions 10 x 1 x 1 mm.$^3$ was manufactured from the rod thus purified and doped. The rods were successively subjected to different tempering treatments in a known two-oven space constituting a closed system, in which the CdTe-rod was heated to the desired treatment temperature in one oven and cadmium or tellurium was heated to a suitable temperature in the second oven, which was in communication with the first oven, in order to adjust the partial pressures desired. It will be evident that it is only necessary to adjust a partial pressure of only one component, namely that having the maximum pressure required for the adjustment, since the partial pressure of the other component then automatically adjusts itself to the value corresponding to the conditions of equilibrium. The treatment temperatures were chosen at 700° C., 800° C. and 900° C., a large number of rods being heated at each of said temperatures at different Cd-pressures. The experiments revealed that all of the cadmium-telluride rods treated at cadmium pressures lower than the values specified for the different treatment temperatures in the table following hereinafter, had a specific resistance between $10^7$ and $10^8$ ohm-mc. In addition the required duration of treatment in hours was measured at the different treatment temperatures. The table specifies the logarithmic value of $P_{Cd}$ in atm. corresponding to the base number 10.

| Treatment Temperature in ° C. | $^{10}\log. p_{Cd}$ | Required Duration of Treatment in Hours |
|---|---|---|
| 700 | −2.8 | 16 |
| 800 | −1.7 | 5 |
| 900 | −0.8 | 3 |

The values specified in this table are measuring points of the straight line 5 in the figure. Experiments with CdTe doped with $1.3\times10^{17}$ of In/cm.$^3$ and $5\times10^{17}$ of In/cm.$^3$ revealed, as may also be seen from the figure, that the upper limit of the partial Cd-pressure was only a little dependent upon the concentration used.

The experiments also showed that a body having a high-ohmic superficial layer of a desired thickness may be manufactured by choosing a shorter duration of treatment. The high-ohmic layer extends during treatment from the surface towards the interior of the body. High-ohmic material having a specific resistance between $10^7$ and $10^8$ ohm-cm. was obtained in the whole region between the solidus line 1 and the straight lines 4, 5 or 6 of the figure corresponding to the In-concentration.

*Example 2*

A CdTe-rod which was purified and doped with indium in the same manner as described in Example 1, was brought into the pulverulent state and, subsequently, a pill of good coherence, having a thickness of 1 mm. and a diameter of about 2 cms., was pressed from it at a pressure of about 20 tons/cm.$^2$. Said pill was subjected in a tube open at both ends to a temperature treatment at 1000° C. in a flow of nitrogen gas as a carrier of 600 ccs. per hour which was passed through the tube and before coming into contact with the pill had been led over cadmium telluride which was heated a little upwards of 1000° C., so that the gas flow was charged with cadmium telluride, cadmium and tellurium vapors whose pressures depended on the heating temperature of the compound. In such a case, the equilibrium situation corresponding to the curve 7 of the figure is obtained. A treatment for 1 hour was found to be sufficient for converting the cadmium-telluride pill completely into high-ohmic cadmium telluride having a specific resistance of about $10^8$ ohm-cm. The partial pressures of the components adjusted themselves to an equilibrium located on or near the straight line 7 of the figure, so that the partial pressure of the cadmium can be found by determining that point on the curve 7 corresponding to a temperature of 1000° C. Since sintered material usually needs a shorter duration of treatment than monocrystalline material, the treatment lasted only a short time, so that the sublimation was found in practice to be little troublesome. The sublimation was also suppressed due to the gas flow having been preliminarily led over heated CdTe.

*Example 3*

A plurality of small rods having dimensions of 10 x 1 x 1 mm. was manufactured from a CdTe-rod which had been purified by zone-melting up to an impurity concentration less than $10^{16}$/cm.$^3$ and subsequently doped homogenously with $5\times10^{17}$ of Ga/cm.$^3$ by zone-levelling and brought into a monocrystalline state. One of the rods was after-baked at 800° C. in the first oven of a two oven room as in Example 1, tellurium being heated in the second oven at a temperature producing a partial Cd-pressure of about $8.5\times10^{-4}$ atm. The temperature, of course, depends upon the well-known partial vapor pressure relationship $P_{Cd}\times P_{Te}=C\times P_{CdTe}$, where C is a constant dependent on temperature. After a treatment of about 5 hours, the rod was completely converted into high-ohmic CdTe having a specific resistance between $10^7$ and $10^8$ ohm-cm. Another rod was heated to 700° C. in the first oven, and tellurium heated in the second oven at a temperature providing a Cd-pressure of about $1.1\times10^{-5}$ atm. After 16 hours, the rod was completely converted into high-ohmic CdTe having a specific resistance between $10^7$ and $10^8$ ohm-cm. It is to be noted that, according to the above examples, Ga also yields satisfactory results, but that indium is usually more favorable since gallium sooner gives rise to cluster effects.

*Example 4*

A small rod of very pure CdTe having an impurity concentration lower than $10^{16}$/cm.$^3$ was heated in a closed system simultaneously in an atmosphere of a volatile donor and at suitable partial Cd-pressure. The CdTe-rod (10 x 1 x 1 mm.) was heated to 900° C. in the closed system, a suitable bromine pressure and a suitable partial Cd-pressure of about 0.1 atm. being provided by heating a mixture of cadmium and cadmium bromide (1:1) to about 625° C. After thus having been treated for 5 hours, the whole rod was found to be converted into high-ohmic CdTe having a specific resistance of $10^7$ ohm-cm.

What is claimed is:

1. A method of making a cadmium telluride semiconductor body containing a portion whose resistivity is at least $10^5$ ohm-cm., comprising the steps providing the said cadmium telluride portion with a predominant donor impurity concentration of at least $10^{15}$ atoms/cm.$^3$, and heating said donor-doped portion at a temperature between 500° C. and the maximum melting temperature of cadmium telluride in the presence of an atmosphere of cadmium vapor at a partial pressure below the partial cadmium pressure of stoichiometric cadmium telluride at the said temperature and above the partial cadmium pressure of solid cadmium telluride in equilibrium with its liquid at the said temperature until the said portion acquires the desired resistivity when cooled.

2. A method as set forth in claim 1 wherein the donor impurtiy concentration lies between $10^{17}$ and $5\times10^{17}$ atoms/cm.$^3$.

3. A method of making a cadmium telluride semiconductor body containing a portion whose resistivity is at least $10^6$ ohm-cm., comprising the steps providing the said cadmium telluride portion with a predominant donor impurity concentration of between $10^{16}$ and $10^{18}$ atoms/cm.$^3$, and heating said donor-doped portion at a temperature between 500° C. and 1000° C. in the presence of an atmosphere of cadmium vapor at a partial pressure below the partial cadmium pressure of stoichiometric cadmium telluride at the said temperature and above the partial cadmium pressure of solid cadmium telluride in equilibrium with its liquid at the said temperature until the said portion acquires the desired resistivity when cooled.

4. A method as set forth in claim 3 wherein the donor impurity is indium.

5. A method as set forth in claim 3 wherein the donor impurity is added to the body portion by a melting process before the heating step.

6. A method as set forth in claim 3 wherein the donor impurity is added to the body portion during the heating step.

7. A semiconductor device comprising a cadmium telluride body having a portion whose resistivity is at least $10^5$ ohm-cm., said body portion containing a predominant donor impurity concentration of at least $10^{15}$ atoms/cm.$^3$ and a substantially equal number of energy levels not originating from other impurities and located approximately at the center between the valence and conduction bands of the said body portion, said body having been produced by the method set forth in claim 1.

References Cited in the file of this patent

UNITED STATES PATENTS 2,916,678 Bube ---------------- Dec. 8, 1959